United States Patent [19]

Yoshinaga et al.

[11] Patent Number: 5,418,113
[45] Date of Patent: May 23, 1995

[54] PHOTOSENSITIVE RESIN COMPOSITION AND METHOD OF PREPARING VOLUME TYPE PHASE HOLOGRAM MEMBER USING SAME

[75] Inventors: Yoko Yoshinaga, Machida; Naosato Taniguchi; Hiroyoshi Kishi, both of Atsugi; Tetsuro Kuwayama, Yokohama; Nobuo Kushibiki, Yamato, all of Japan

[73] Assignee: Canon Kabushiki Kaisha, Tokyo, Japan

[21] Appl. No.: 25,816

[22] Filed: Mar. 3, 1993

Related U.S. Application Data

[63] Continuation of Ser. No. 436,760, Nov. 15, 1989, abandoned.

[30] Foreign Application Priority Data

| Nov. 18, 1988 | [JP] | Japan | 63-290091 |
| Nov. 18, 1988 | [JP] | Japan | 63-290092 |
| Nov. 18, 1988 | [JP] | Japan | 63-290094 |
| Nov. 18, 1988 | [JP] | Japan | 63-290095 |
| Nov. 18, 1988 | [JP] | Japan | 63-290097 |
| Nov. 18, 1988 | [JP] | Japan | 63-290098 |
| Oct. 6, 1989 | [JP] | Japan | 1-260239 |

[51] Int. Cl.[6] ............................................. G03C 1/73
[52] U.S. Cl. .......................................... 430/286; 430/1; 430/2; 522/26; 522/65
[58] Field of Search ............... 430/1, 2, 296, 281, 430/290, 920, 916; 522/25, 26, 130, 151, 31, 63, 465

[56] References Cited

U.S. PATENT DOCUMENTS

| 3,503,745 | 3/1970 | Yamada et al. | 96/90 |
| 3,615,430 | 10/1971 | Bruck et al. | 430/346 |
| 3,728,120 | 4/1973 | Hazenbosch et al. | 96/48 |
| 3,775,130 | 11/1973 | Enomoto et al. | 430/282 |
| 3,825,317 | 7/1974 | Inoue et al. | 470/1 |
| 3,915,705 | 10/1975 | Hazenbosch et al. | 430/282 |
| 3,953,210 | 4/1976 | Hasegawa et al. | 522/63 |
| 4,042,388 | 8/1977 | Inoue et al. | 430/81 |
| 4,501,808 | 2/1985 | Sakai et al. | 430/72 |
| 4,598,036 | 1/1986 | Iwasaki et al. | 430/287 |
| 4,774,163 | 9/1988 | Higashi | 430/920 |
| 4,871,411 | 10/1989 | Kushibiki et al. | 156/249 |
| 4,908,285 | 3/1990 | Kushibiki et al. | 156/249 |
| 5,154,994 | 10/1992 | Yamagishi et al. | 430/2 |

FOREIGN PATENT DOCUMENTS

| 0084452 | 1/1983 | European Pat. Off. . |
| 0235038 | 2/1987 | European Pat. Off. . |
| 54-17015 | 2/1979 | Japan | 522/65 |
| 57-21401 | 2/1982 | Japan | 522/26 |
| 215284 | 9/1987 | Japan . |

OTHER PUBLICATIONS

Patent Abstracts of Japan, vol. 12, No. 76 (Mar. 1988) pp.-675, 2923.
J. K. Kochi, Free Radical (1973).

*Primary Examiner*—Charles L. Bowers, Jr.
*Assistant Examiner*—Martin J. Angebranndt
*Attorney, Agent, or Firm*—Fitzpatrick, Cella, Harper & Scinto

[57] ABSTRACT

A photosensitive resin composition comprises (a) a polyvinylcarbazole type polymer, (b) a halogen-containing compound and (c) or least one compound selected from the group consisting of a triarylhydrazyl, a triarylcarbonium type coloring matter having at least one carbazolyl group, and a reaction product of a styryl base with a halogenated carbon. A method of preparing a volume type hologram member comprises the steps of: subjecting a photosensitive material having a photosensitive layer comprising the photosensitive resin composition to exposure using a laser beam to form an interference pattern; and subjecting the photosensitive material thus exposed to light to development processing using a solvent.

21 Claims, 3 Drawing Sheets

PHOTOSENSITIVE RESIN COMPOSITION AND METHOD OF PREPARING VOLUME TYPE PHASE HOLOGRAM MEMBER USING SAME

This application is a continuation of application Ser. No. 07/436,760 filed Nov. 15, 1989, now abandoned.

BACKGROUND OF THE INVENTION

1. Field of the invention

The present invention relates to a photosensitive resin composition having a sensitivity to light of a long wavelength, of a laser such as a helium-neon laser or a semiconductor laser, and a method of preparing a volume type phase hologram member using the composition.

2. Related Background Art

Diligent research efforts and progress have recently been made on photosensitive materials used for laser beam writing, both in the field of image recording techniques of digital systems and in the field of holography.

In particular, there are strong demands for photosensitive resins or photosensitive materials having a sensitivity to long-wavelength light of helium-neon lasers, semiconductor lasers, etc. that ranges from the visible region to the near infrared region.

To satisfy such demands, a proposal has hither to been made in Japanese Patent Application Laid-open No. 62-215284 for a photosensitive material for hologram recording and designed to have a sensitivity to long-wavelength laser light. Disclosed in the Japanese Patent Application is a photosensitive material comprising a carbazole ring-containing polymer as a chief agent and a triphenylmethane-type dye contained as a photoreaction initiator.

Such a photosensitive material, however, has had the problem that the triphenylmethane type dye is dissolved in an organic solvent only with difficulty. In particular, the dye has such poor solubility in an aromatic solvent that removal of the dye after exposure to laser light can only be accomplished with difficulty.

Such a photosensitive material has also had the problem that it has no sensitivity to the light of semiconductor lasers, which light is longer in wavelength than the light of helium-neon lasers.

SUMMARY OF THE INVENTION

Accordingly, a first object of the present invention is to eliminate the disadvantages in the above prior art to provide a novel photosensitive resin composition having a high sensitivity to long-wavelength laser light.

A second object of the present invention is to provide a method of preparing a volume type phase hologram member that uses the long-wavelength laser light, and possesses all of the advantages of the above novel photosensitive resin composition.

The present invention provides a photosensitive resin composition comprising;
(a) a polyvinylcarbazole type polymer;
(b) a halogen-containing compound; and
(c) at least one compound selected from the group consisting of a triarylhydrazyl, a triarylcarbonium type coloring matter having at least one carbazolyl group, and a reaction product between a styryl base and a halogenated carbon.

The present invention also provides a photosensitive material comprising a photosensitive layer containing;
(a) a polyvinylcarbazole type polymer;
(b) a halogen-containing compound; and
(c) at least one compound selected from the group consisting of a triarylhydrazyl, a triarylcarbonium type coloring matter having at least one carbazolyl group type, and a reaction product of a styryl base with a halogenated carbon.

The present invention still also provides a method of preparing a volume type phase hologram member, which method comprises the steps of: subjecting a photosensitive material to exposure using a laser beam to form an interference pattern, followed by subjecting the thus exposed photosensitive material to development processing using a solvent, wherein said photosensitive material has a photosensitive layer comprised of a resin composition containing:
(a) a polyvinylcarbazole type polymer;
(b) a halogen-containing compound; and
(c) at least one compound selected from the group consisting of a triarylhydrazyl, a triarylcarbonium type coloring matter having at least one carbazolyl group, and a reaction product of a styryl base and a halogenated carbon.

DETAILED DESCRIPTION OF THE PREFERRED EMBODIMENTS

The polyvinylcarbazole (hereinafter "PVCz") type polymer refers to a polymer produced by polymerizing a composition mainly composed of a monomer such as vinylcarbazole, an alkyl-substituted derivative thereof or a halogen-substituted derivative thereof, or an acrylic acid derivative or vinyl () acetate derivative having a carbazole group at its side chain. It specifically includes, for example, PVCz, 3-chlorovinylcarbazole polymer, 3-bromovinylcarbazole polymer, 3-iodovinylcarbazole polymer, 3-methylvinylcarbazole polymer, 3-ethylvinylcarbazole polymer, chlorineted PVCz, bromineted PVCz, and a polymer made from a monomer represented by the following structural formula (I) or (II).

-continued

(II)

Of these, the unsubstituted PVCz is advantages to use since it is readily available and also can give a photosensitive resin composition with a particularly superior performance.

The above PVCz polymers may optionally be copolymerized with additional monomers for the purpose of, for example, controlling properties such as strength and flexibility required when they are formed into films. The additional monomers used for such purpose include, for example, in addition to the above vinylcarbazoles, vinyl esters such as vinyl acetate, an ester of acrylic acid or methacrylic acid, in particular, the esters represented by the above structural formula (I) or (II), and vinyl type monomers such as styrene and styrene derivatives. These monomers are copolymerizable by copolymerization. It is also possible to use other polymers as exemplified by polystyrene, a styrene/butadiene copolymer and a styrene/hydrogenated butadiene copolymer, which may be blended within a range such that the resin composition sensitivity and recording capabilities are not lowered. These copolymer blends are used by selecting the proportion of addition of the differing monomer units so that the desired properties can be obtained.

The polymer component that mainly composes the photosensitive resin composition of the present invention is required to have previously been made active to radiations, using a halogen-containing compound, preferably an iodine-containing compound and/or a bromine-containing compound. Preferred examples of such a halogen-containing compound include iodine-containing compounds and bromine-containing compounds such as carbon tetraiodide, iodoform, ethylene tetraiodide, triiodoethane, tetraiodoethane, pentaiodoethane, hexaiodoethane, carbon tetrabromide, and ethylene tetrabromide. These halogen-containing compounds are added to the above polymer in the proportion of from 1 to 100% by weight, and preferably from 3 to 25% by weight, based on the above PVCz polymer. The addition of the halogen-containing compound as described above at an excessively small amount may bring about so low a sensitivity of the resulting composition that the exposure time required may be undesirably long. On the other hand, the addition of an excessively large amount may result in undecomposed halogen-containing compounds remaining in the composition, thus necessitating additional treatment to remove all of them and, further, undesirably causes voids in the hologram member.

In the present invention, the above PVCz polymer and halogen-containing compound are used in combination with a sensitizer having properties of absorbing long wavelength light and sensitizing the halogen-containing compound, which is exemplified by the following sensitizers (I), (II) and (III). The sensitizer (I) includes a triarylhydrazyl represented by the following structural formula:

wherein Ar$^1$ and Ar$^2$ independently represent a substituted or unsubstituted aryl group.

More preferably, the sensitizer (I) may include an electron accepting group such as a nitro group, a sulfonic acid group or an alkoxycarbonyl group at the ortho position or further at the para position of Ar$^1$ in the above formula. (At the meta position, either an electron-accepting group or an electron-donating group may be present.)

Ar$^2$ in the above formula may also have 1 to 3 substituents such as halogen atoms, lower alkyl groups, alkoxycarbonyl groups, hydroxyl groups, and alkoxy groups. In the present invention, particularly preferred examples of the compound of the above formula include the following compounds:

In the above structural formulas, R represents a substituent such as a halogen atom, a lower alkyl group, an alkoxycarbonyl group, a hydroxyl group or an alkoxy group; and Ph represents a phenyl group. The triarylhydrazyl as described above can be prepared, for example, by the method as disclosed in J. K. Kochi, Free Radical, p.557.

The sensitizer (II) may include a triarylcarbonium type coloring matter represented by the following structural formula:

R$_1$ to R$_3$ in the above formula represent independently an aromatic group having a halogen atom, an alkyl group such as a methyl group or an ethyl group, an alkoxy group such as a methoxy group or an ethoxy group, an amino group, a substituted amino group such as a monomethylamino group, a monoethylamino group, a dimethylamino group or a diethylamino group, a carboxyl group, or a sulfonic acid group, provided that at least one of $R_1$, $R_2$ and $R_3$ is a carbazolyl group; and X represents an anion such as chloride, bromide, group, an alkoxy group such as a methoxy group or an ethoxy group.

Particularly preferred examples of the triarylcarbonium type coloring matters include the following:

iodide, chlorate or tetrafluoroborate.

A triarylcarbonyl type coloring matter particularly preferred in the present invention is a compound in which at least one of the above three $R_1$, $R_2$, $R_3$ groups is a carbazolyl group of the following formula:

$R_4$ in the above formula represents a hydrogen atom, an alkyl group such as a methyl group or an ethyl group, or an alkyl halide group such as an ethyl iodide group; $R_5$ represents a hydrogen atom, a halogen atom, an alkyl group such as a methyl group or an ethyl

X in the above formulas is as defined above.

It may also include triarylcarbonium type coloring matters known to be formed by carbazole and a halogenated methane.

The sensitizer (III) used in the present invention is a coloring matter known to be formed as a result of the photoreaction of a styryl base such as a styryl group-bonded heterocyclic compound, with a carbon halide, particularly including carbon tetraiodide, iodoform, ethylene tetraiodide, triiodoethane, tetraiodoethane, pentaiodoethane, hexaiodoethane, carbon tetrabromide, ethylene tetrabromide, and methyl iodide, ethyl iodide, buryl iodide, octyl iodide and the corresponding bromides.

The styryl base used in the above reaction may specifically include, for example, dye precursors represented by the following structural formula:

(III-1)

(III-2)

(III-3)

(III-4)

(III-5)

(III-6)

(III-7)

(III-8)

(III-9)

(III-10)

and (III-11)

The sensitizers (I), (II) and (III) used in the present invention may be added in the proportion of from 0.01 to 25% by weight, and preferably from 0.1 to 10% by weight, based on the polymer to the photosensitive resin composition. Addition of one of the above sensitizers in an amount less than the above range may result in an insufficient sensitizing action. On the other hand, addition of an amount more than the above range may bring about no improvement in sensitizing action with and may also undesirably give rise to voids in the hologram member.

The photosensitive resin composition of the present invention can be obtained by dissolving the above described PVCz polymer, halogen-containing compound and a sensitizer in a good solvent for the PVCz polymer. In view of the solubility to the PVCz polymer, boiling point, etc., preferred solvents include benzene, xylene, chlorobenzene, chloroform, dichloroethane, dichloroethylene, trichloroethylene, pyridine, dioxane, tetrahydrofuran, or a mixture of any of these.

The PVCz polymer may be dissolved by usual operation without any particular limitations, e.g., by putting it in the above organic solvent, optionally followed by heating, filtering to remove insoluble matters, and leaving to remove air bubbles.

The photosensitive resin composition of the present invention may be in the form of the above solution, or may also be in the form Of a film. When it is in the form of a film, it can be obtained by preparing a solution of the photosensitive resin composition described above, and coating the solution on a suitable substrate such as a glass sheet or a plastic film sheet, followed by drying to form a coating film. The film thus obtained may preferably have a thickness of from 1 to 40 μm, more preferably 5 to 20 μm, as a dried film thickness. It may remain supported on the substrate or may be made peelable therefrom.

The above-described photosensitive resin composition of the present invention is sufficiently sensitive to the light of helium-neon lasers which are simple in mechanism and also inexpensive, and also responsive to the light of semiconductor lasers. Thus, the present composition is useful in forming a volume type phase hologram, a light-scattering pattern, a relief pattern, etc.

As an example of the use of the above photosensitive resin composition of the present invention, an instance in which it is used in hologram recording will now be described.

A hologram recording medium comprising the 1 photosensitive resin composition of the present invention can be obtained by preparing a solution of the photosensitive resin composition described above, and applying the solution to a suitable substrate such as a glass sheet or a plastic film sheet to form a coating film thereon.

Figure 2:
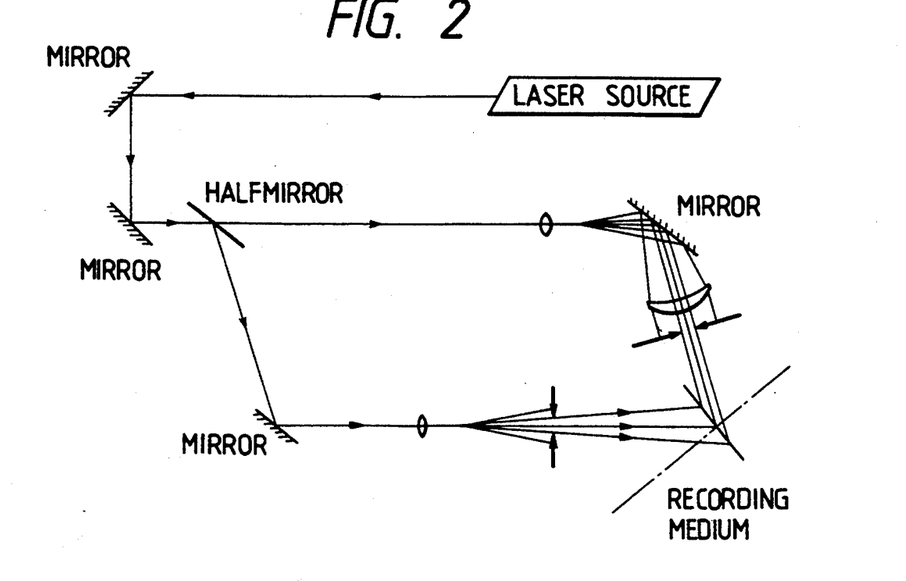
FIG. 2 schematically illustrates an optical system utilized in the method of preparing a hologram member according to the present invention.

The recording medium thus formed is exposed to light in an optical system as shown in FIG. 2, using two beams of coherent light from a laser, i.e., the object beam and the reference beam are coherent visible light of up to 830 nm.

A subsequent developing process comprises two step, a swelling step and a shrinking step.

More specifically, a recording layer on which a hologram latent image has been formed through the above exposure step is processed with a first solvent serving as a swelling solution, to cause the recording layer to swell in the areas corresponding to the hologram pattern formed. The recording layer in the swelled state is then shrunk by the subsequent processing with a second solvent. Thus, a hologram is amplified and fixed.

The first solvent used in the swelling step includes, for example, benzene, toluene, xylene (an ortho isomer, a meta isomer, a para isomer, and a mixture of these), benzene and naphthalene derivatives such as ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene, pyran, and halogen-substituted and saturated or unsaturated hydrocarbons such as dichloromethane, chloroform, trichloroethylene, trichloroethane, dichloroethane and bromoform.

The second solvent used in the shrinking step includes, for example, alkanes or cycloalkanes such as n-pentane, n-hexane, n-heptane, n-octane, isooctane and cyclohexane, alcohols such as methyl alcohol, ethyl alcohol, n-propyl alcohol, isopropyl alcohol, n-butyl alcohol, tert-butyl alcohol, n-amyl alcohol and isoamyl alcohol, and ethers such as diethyl ether, methyl ethyl ether and diisopropyl ether. The swelling and shrinking processing can also be used by mixing the above first solvent and second solvent in an appropriate proportion.

The volume type phase hologram member thus obtained has various superior performances such as light-resistance, moisture resistance, diffraction efficiency, transparency and low haze, and can be satisfactorily used for various purposes in either its adhered state on the substrate, or as a hologram film peelable from the substrate.

EXAMPLES

The present invention will be described below in greater detail by giving Examples and Comparative Examples.

Example 1

Figure 1:
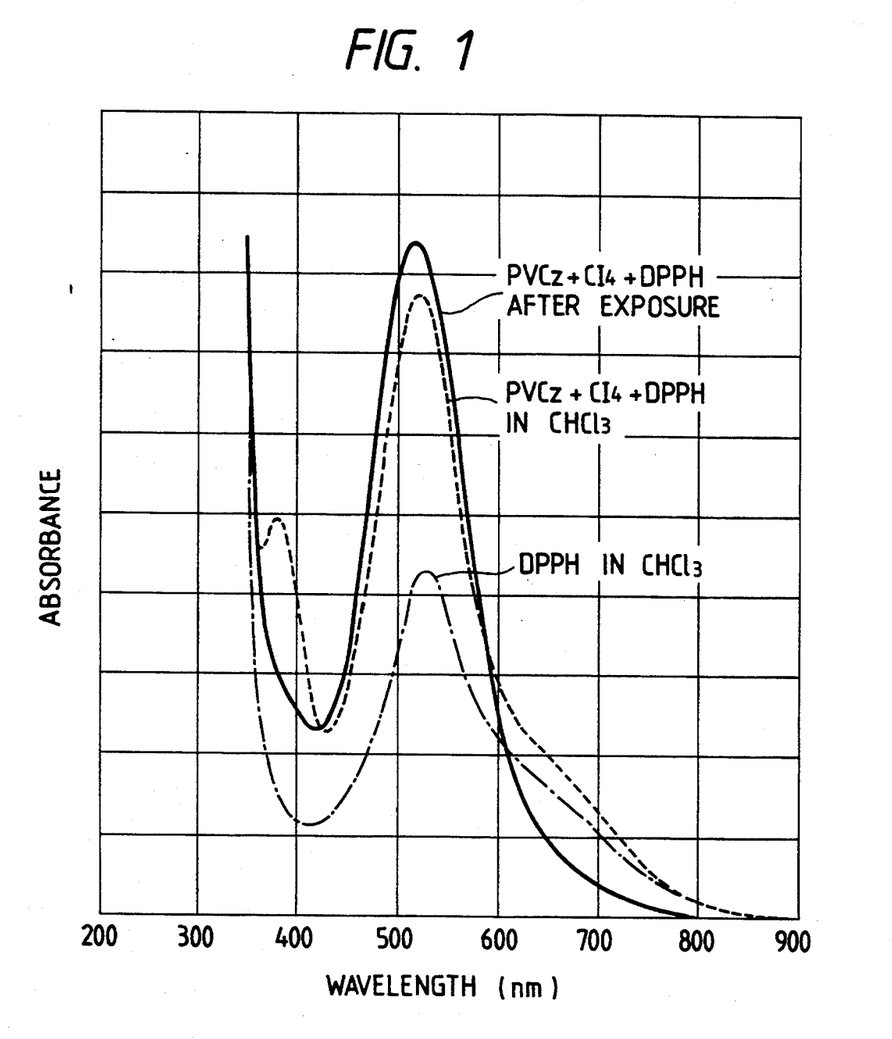
FIG. 1 shows visible light absorption spectra in an example of the present invention.

In 60 g of chlorobenzene, 4.5 g of PVCz (Luvican; a product of BASF), 0.3 g of carbon tetraiodide and 0.15 g of the above exemplary (I-1) triarylhydrazyl (DPPH: diphenylpicrylhydrazyl) were dissolved in the dark to give a solution-like photosensitive resin composition. This photosensitive resin composition, the spectra of which are as shown in FIG. 1, shows a decay in the absorption of carbon tetrachloride having a peak at 380 nm, when irradiated with helium-neon laser beams (wavelength: 632.8 nm). After the reaction the polymer is cross-linked and turns insoluble.

A 100 μm thick polyester film base was coated with the above composition so as to give a dried film thickness of 2 μm, followed by drying to form a photosensitive resin composition film.

A negative film was brought into close contact with the resulting film, which was then exposed to light at 150 mJ/cm$^2$ using a helium-neon laser (wavelength: 632.8 nm).

Next, the above film was immersed in a benzene solvent for 5 seconds, and thereafter immersed in methyl alcohol for 5 seconds, followed by drying. As a result, unexposed areas turned opaque, and, when viewed by reflection, a sharp positive and visible pattern was obtained.

Example 2

In Example 1, the processing using the benzene solvent was carried out for 3 minutes. As a result, unexposed areas were dissolved away, and a transparent relief pattern was formed after drying.

Examples 3 to 6

Using the same recording medium as in Example 1, positive and visible patterns were formed using lasers of different wavelengths as shown below. In each Example, a sharp positive pattern was obtained in the amount of exposure as shown below.

| Example No. | Laser | Wavelength (nm) | Amount of exposure (mJ/cm$^2$) |
| --- | --- | --- | --- |
| 3 | Argon | 514.5 | 100 |
| 4 | Ruby | 694.3 | 200 |
| 5 | Semiconductor | 780 | 280 |
| 6 | Semiconductor | 830 | 300 |

Examples 7 & 8

Using photosensitive material components different from those used in Example 1, positive and visible patterns were formed according to the same method as in Example 4. Each amount of exposure is shown below.

| Example No. | Photosensitive material components | Amount of exposure (mJ/cm$^2$) |
| --- | --- | --- |
| 7 | Triarylhydrazyl(I-2) + CI$_4$ | 250 |
| 8 | Triarylhydrazyl(I-3) + CI$_4$ | 200 |

Example 9

In 60 g of chlorobenzene, 4.5 g of PVCz (Luvican M-170; a product of BASF), 0.3 g of carbon tetraiodide and 0.15 g of the above exemplary (II-1) triarylcarbonium coloring matter (X=I$^-$) were dissolved in the dark to give a solution-like photosensitive resin composition.

A 100 μm thick polyester film base was coated with the above composition so as to give a dried film thickness of 2 μm, followed by drying to form a photosensitive resin composition film.

A negative film was brought into close contact with the resulting film, which was then exposed to light at 100 mJ/cm$^2$ using a helium-neon laser (wavelength: 632.8 nm).

Next, the above film was immersed in a benzene solvent for 5 seconds, and thereafter immersed in methyl alcohol for 5 seconds, followed by drying. As a result, unexposed areas turned opaque, and, when viewed by reflection, a sharp positive and visible pattern was obtained.

Example 10

In Example 9, the processing using the benzene solvent was carried out for 3 minutes. As a result, unexposed areas were dissolved away, and a transparent relief pattern was formed after drying.

Examples 11 to 13

Using the same recording medium as in Example 9, positive and visible patterns were formed using lasers of different wavelengths as shown below. Results obtained are shown below.

| Example No. | Laser | Wavelength (nm) | Amount of exposure (mJ/cm$^2$) |
| --- | --- | --- | --- |
| 11 | Ruby | 694.3 | 130 |
| 12 | Semiconductor | 780 | 200 |
| 13 | Semiconductor | 830 | 320 |

Examples 14 to 17

Using photosensitive material components different from those used in Example 9, positive and visible patterns were formed according to the same method as in Example 9. Results obtained are shown below.

| Example No. | Photosensitive material components | Amount of exposure (mJ/cm$^2$) |
| --- | --- | --- |
| 14 | Triarylcarbonium(II-2) + CI$_4$ | 130 |
| 15 | Triarylcarbonium(II-3) + CI$_4$ | 150 |
| 16 | Triarylcarbonium(II-4) + CI$_4$ | 100 |
| 17 | (Reaction product of ethylcarbazole with CI$_4$) + CI$_4$ | 100 |

Figure 4:
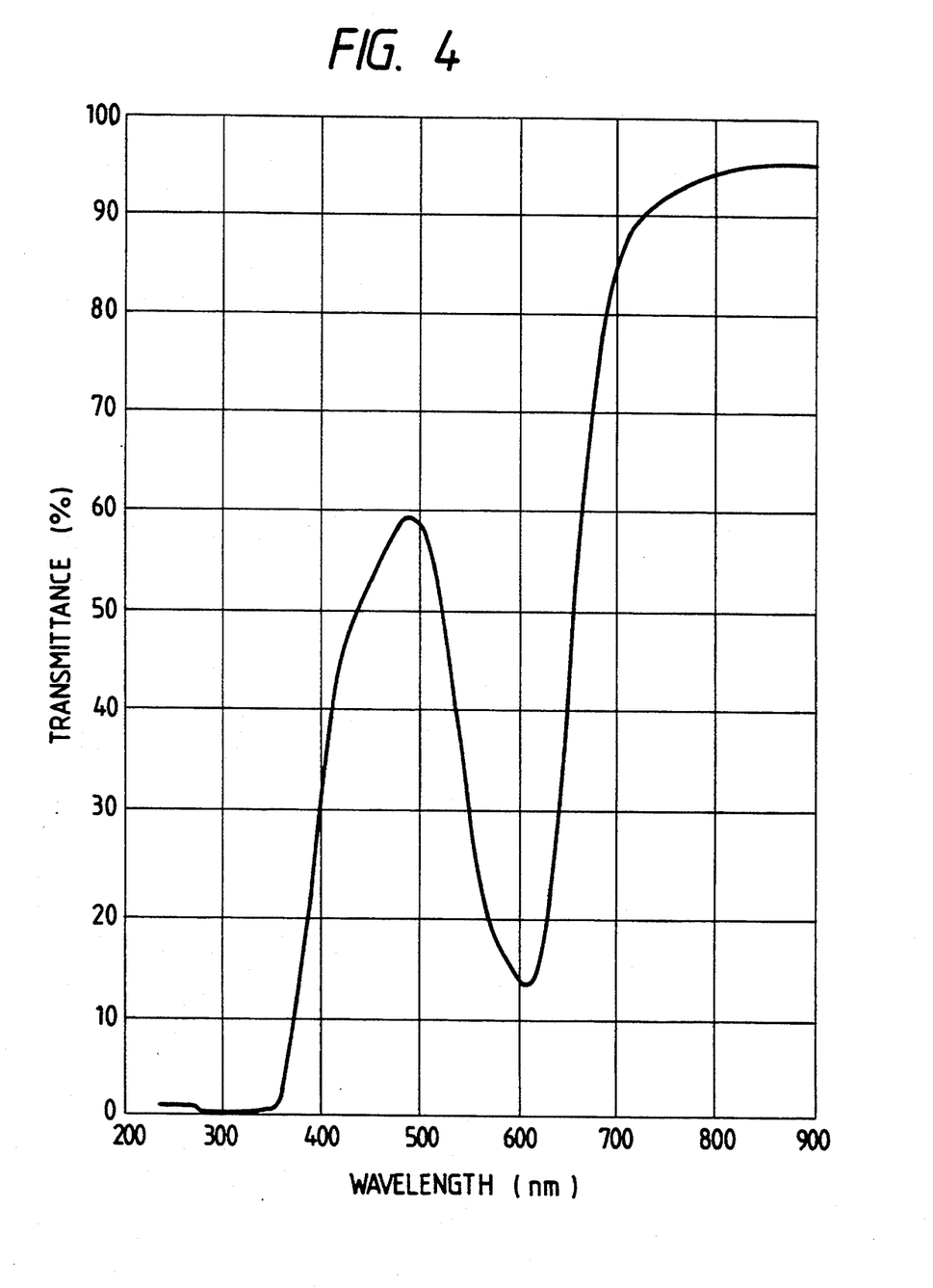
FIG. 4 shows a visible light absorption spectrum of a certain sensitizer used in the present invention.

In Example 17, the reaction product of ethylcarbazole with CI$_4$ was formed by dissolving ethylcarbazole (0.6 g) and carbon tetraiodide (0.2 g) in 300 ml of benzene, followed by exposure using a high-pressure mercury lamp (500 W). The resulting coloring matter was used after removal of the solvent, but without purification. The spectrum obtained is shown in FIG. 4

Example 18

In 60 g of chlorobenzene, 4.5 g of PVCz (Luvican M-170; a product of BASF), 0.3 g of carbon tetraiodide and 0.15 g of a photoreaction product of a styryl base [the above exemplary dye (III-3)]with iodoform in a molar ratio of 1:1 were dissolved in the dark to give a solution-like photosensitive resin composition.

The reaction product of the styryl base [the above exemplary dye (III-3)] with iodoform was formed by dissolving the styryl base and iodoform in a molar ratio of 1:1 in a benzene-ethanol mixed solution, followed by exposure using a high-pressure mercury lamp (500 W). The reaction process was traced by the measurement of the shift of a peak to the long wavelength side, based on the visible absorption spectrum. The resulting coloring matter was used after removal of the solvent, but without purification.

A 100 μm thick polyester film base was coated with the above composition so as to give a dried film thickness of 2 μm, followed by drying to form a photosensitive resin composition film.

A negative film was brought into close contact with the resulting film, which was then exposed to light at 150 mJ/cm$^2$ using a helium-neon laser (wavelength: 632.8 nm).

Next, the above film was immersed in a benzene solvent for 5 seconds, and thereafter immersed in methyl alcohol for 5 seconds, followed by drying. As a result, unexposed areas turned opaque, and, when viewed by reflection, a sharp positive visible pattern was obtained.

Example 19

In Example 18, the processing using the benzene solvent was carried out for 3 minutes. As a result, unexposed areas were dissolved away, and a transparent relief pattern was formed after drying.

Examples 20 to 22

Using the same recording medium as in Example 18, positive and visible patterns were formed using lasers of different wavelengths as shown below. Results obtained are shown below.

| Example No. | Laser | Wavelength (nm) | Amount of exposure (mJ/cm$^2$) |
| --- | --- | --- | --- |
| 20 | Argon | 514.5 | 180 |
| 21 | Ruby | 694.3 | 250 |
| 22 | Semiconductor | 780 | 300 |

Example 23

Using photosensitive material components different from those used in Example 18, positive and visible patterns were formed according to to the same method as in Example 18. Results obtained are shown below.

| Styryl base photoreaction product | Carbon halide | Amount of (mJ/cm$^2$) |
| --- | --- | --- |
| (III-2) | CI$_4$ | 130 |
| (III-3) | CI$_4$ | 130 |
| (III-4) | CI$_4$ | 170 |
| (III-5) | CI$_4$ | 150 |
| (III-6) | CI$_4$ | 100 |
| (III-7) | CI$_4$ | 130 |
| (III-8) | CI$_4$ | 150 |
| (III-9) | CI$_4$ | 150 |

Example 24

In 60 g of chlorobenzene, 4.5 g of PVCz (Luvican M-170; a product of BASF), 0.3 g of carbon tetraiodide and 0.15 g of the above exemplary (I-1) triarylhydrazyl (DPPH: diphenylpicrylhydrazyl) were dissolved in the dark. A cleaned glass sheet was coated with the resulting solution, using a spinner, followed by drying to form a recording layer of 7.2 μm thick. This recording layer was exposed to light at 200 mJ/cm$^2$ using a helium-neon laser (wavelength: 632.8 nm). A hologram was thus recorded After the exposure, the resulting recording material was immersed in 30° C xylene for 1 minute, and thereafter immersed in n-heptane for 1 minute, followed by drying to obtain a volume type phase hologram member. The diffraction efficiency of this hologram was measured by means of a spectrophotometer to which a reflection unit was connected. As a result, the hologram was found to have a maximum diffraction efficiency of 75% at 649 nm.

Examples 25 to 28

Using the same recording medium as in Example 24, hologram members were made in the same manner as in Example 24 except for using lasers of different wavelengths as shown below. Results obtained are shown below.

| Example No. | Laser | Recording wavelength | Amount of exposure | Diffraction wavelength | Diffraction efficiency |
| --- | --- | --- | --- | --- | --- |
| 25 | Argon | 514.5 nm | 100 mJ/cm$^2$ | 530 nm | 85% |
| 26 | Ruby | 694.3 nm | 100 mJ/cm$^2$ | 730 nm | 50% |
| 27 | SemiCD* | 780 nm | 300 mJ/cm$^2$ | 790 nm | 40% |
| 28 | SemiCD* | 830 nm | 300 mJ/cm$^2$ | 850 nm | 20% |

*Semiconductor

Examples 29 to 32

Using photosensitive material components different from those used in Example 24, hologram members were made according to the same method as in Example 24. Results obtained are shown below.

| Example No. | Photosensitive material components | Diffraction wavelength | Diffraction efficiency |
| --- | --- | --- | --- |
| 29 | Triarylhydrazyl(I-2) + CI$_4$ | 640 nm | 70% |
| 0 | Triarylhydrazyl(I-2) + CHI$_3$ | 640 nm | 50% |
| 1 | Triarylhydrazyl(I-3) + CI$_4$ | 640 nm | 73% |
| 2 | Triarylhydrazyl(I-3) + CH$_3$ | 640 nm | 55% |

Comparative Example 1

Examples 26, 27 and 28 were repeated to carry out recording, except for using Crystal Violet in place of DPPH. As a result, no holograms were formed.

Comparative Example 2

Figure 3:
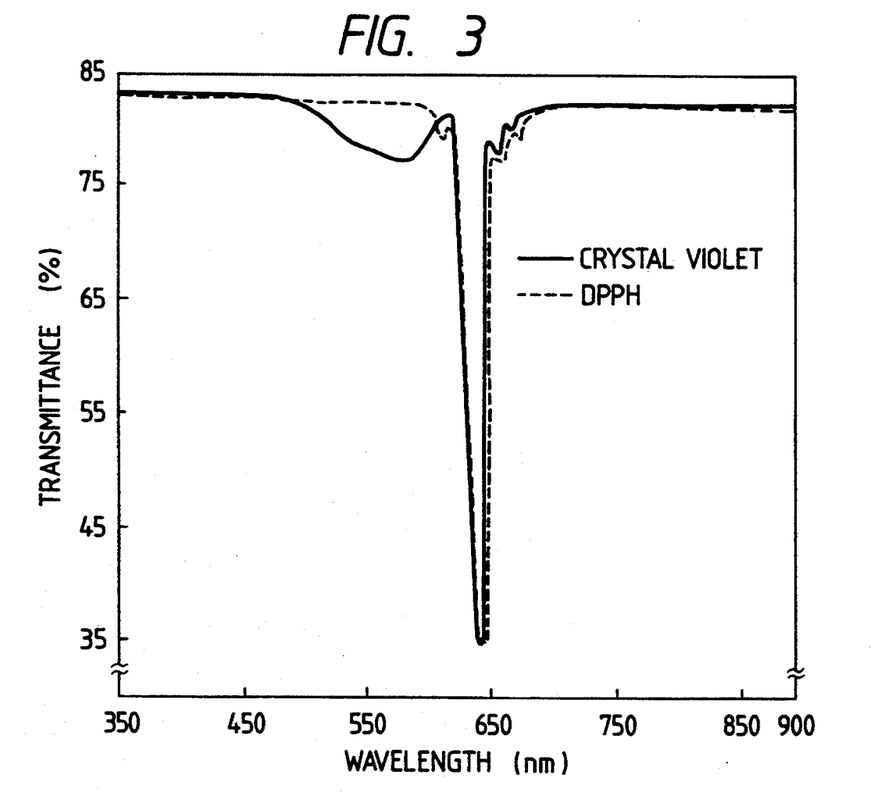
FIG. 3 shows visible light absorption spectra in an example of the present invention and in a comparative example.

Using Crystal Violet in place of DPPH, recording was effected in the same manner as in Example 24. As a result, a broad absorption originating from Crystal Violet was observed around 580 nm, as shown in FIG. 3, and the coloring matter was not completely removed in the developing step. In FIG. 3, the solid line indicates the visible light absorption spectrum according to the present Comparative Example, and the dotted line, the visible light absorption spectrum according to Example 24 which exhibited only diffraction efficiency.

Example 33

In 60 g of chlorobenzene, 4.5 g of PVCz (Luvican M-170; a product of BASF), 0.3 g of carbon tetraiodide and 0.15 g of the above exemplary (II-1) triarylcarbonium coloring matter ($X=I^-$) were dissolved in the dark. A cleaned glass sheet was coated with the resulting solution, using a spinner, followed by drying to form a recording layer of 7.2 μm thick. This recording layer was exposed to light using a helium-neon laser (wavelength: 632.8 nm). A hologram was thus recorded.

After the exposure, the resulting recording material was immersed in 30° C xylene for 1 minute, and thereafter immersed in n-heptane for 1 minute, followed by drying to obtain a volume type phase hologram member. The diffraction efficiency of this hologram was measured by means of a spectrophotometer to which a reflection unit was connected. As a result, the hologram was found to have a maximum 1.0 diffraction efficiency of 75% at 649 nm.

Examples 34 to 37

Using the same recording medium as in Example 33, hologram members were made by using lasers of different wavelengths as exemplified below. Results obtained are shown below.

| Example No. | Laser | Recording wavelength | Amount of exposure | Diffraction wavelength | Diffraction efficiency |
|---|---|---|---|---|---|
| 34 | Argon | 514.5 nm | 100 mJ/cm² | 530 nm | 80% |
| 35 | Ruby | 694.3 nm | 100 mJ/cm² | 720 nm | 63% |
| 36 | SemiCD* | 780 nm | 200 mJ/cm² | 800 nm | 40% |
| 37 | SemiCD* | 830 nm | 300 mJ/cm² | 850 nm | 25% |

*Semiconductor

Examples 38 to 46

Procedure of Example 33 was repeated to make hologram members, except for using photosensitive material components different from those used in Example 33. Results obtained are shown in the following table.

| Example No. | Photosensitive material components | Diffraction wavelength | Diffraction efficiency |
|---|---|---|---|
| 38 | Triarylcarbonium(II-1) + CHI₃ | 649 nm | 60% |
| 39 | Triarylcarbonium(II-2) + CI₄ | 645 nm | 72% |
| 40 | Triarylcarbonium(II-2) + CHI₃ | 645 nm | 55% |
| 41 | Triarylcarbonium(II-3) + CI₄ | 640 nm | 70% |
| 42 | Triarylcarbonium(II-3) + CHI₃ | 640 nm | 52% |
| 43 | Triarylcarbonium(II-4) + CI₄ | 647 nm | 75% |
| 44 | Triarylcarbonium(II-4) + CHI₃ | 647 nm | 54% |
| 45 | (Reaction product of ethylcarbazole with CI₄) + CI₄ | 650 nm | 75% |
| 46 | (Reaction product of ethylcarbazole with CI₄) + CHI₃ | 650 nm | 58% |

Comparative Example 3

Examples 35, 36 and 37 were repeated to carry out recording, except for using Crystal Violet in place of triarylcarbonium dye (II-1). As a result, no hologram members were formed.

Example 47

In 60 g of chlorobenzene, 4.5 g of PVCz (Luvican M-170; a product of BASF), 0.3 g of carbon tetraiodide and 0.15 g of a photoreaction product formed by irradiating with ultraviolet rays a benzene solution of a styryl base [the above exemplary dye (III-3)] and carbon tetraiodide in a molar ratio of 1:1, were dissolved in the dark. A cleaned glass sheet was coated with the resulting solution, using a spinner, followed by drying to form a recording layer of 9.0 μm thick. This recording layer was exposed to light using a helium-neon laser (wavelength: 632.8 nm). A hologram was thus recorded.

After the exposure, the resulting recording material was immersed in 32° C toluene for 1 minute, and thereafter immersed in n-heptane for 1 minute, followed by drying to obtain a volume type phase hologram member. The diffraction efficiency of this hologram was measured by means of a spectrophotometer to which a reflection unit was connected. As a result, the hologram was found to have a maximum diffraction efficiency of 80% at 630 nm.

Examples 48 to 50

Using the same recording medium as in Example 47, hologram members were respectively made by using lasers of different wavelengths as exemplified below. Results obtained are shown below.

| Example No. | Laser | Recording wavelength | Amount of exposure | Diffraction wavelength | Diffraction efficiency |
|---|---|---|---|---|---|
| 48 | Argon | 514.5 nm | 100 mJ/cm² | 530 nm | 85% |
| 49 | Ruby | 694.3 nm | 200 mJ/cm² | 730 nm | 40% |
| 50 | SemiCD* | 780.3 nm | 300 mJ/cm² | 790 nm | 35% |

*Semiconductor

Examples 51 to 55

Procedure of Example 47 was repeated to make hologram members, except for using photosensitive material components different from those used in Example 33. Results obtained are shown below.

| Example No. | Styryl dye photoreacton product | Carbon halide | Diffraction wavelength | Diffraction efficiency |
|---|---|---|---|---|
| 51 | [(III-1) + CHI₃] | CI₄ | 640 | 80 |
| 52 | [(III-1) + ICH₃] | CI₄ | 640 | 83 |
| 53 | [(III-1) + ICH₃] | CHI₃ | 635 | 67 |
| 54 | [(III-2) + CI₄)] | CI₄ | 635 | 60 |
| 55 | [(III-3) + CI₄)] | CI₄ | 635 | 54 |

Comparative Example 4

Examples 49 and 50 were repeated to carry out recording, except for using Crystal Violet in place of the styryl base photoreaction product. As a result, no holograms were recorded.

We claim:

1. A hologram recordable material having a photosensitive composition comprising:
   (a) a polyvinylcarbazole type polymer;

(b) a halogen-containing compound for accelerating the composition sensitivity to light having the formula $C_aX_bH_c$ wherein $a=1$ or 2, $b=3$ to 6 and $c=0$ to 3; X is I or Br; and (c) a triarylhydrazyl sensitizing compound which is capable of absorbing light of from visible to near infrared wavelength regions inclusive and sensitizing the halogen-containing compound.

2. A hologram recordable material according to claim 1, wherein said component (a), component (b) and component (c) of the photosensitive composition are dissolved in a solvent.

3. A hologram recordable material according to claim 1, wherein the photosensitive composition is in the form of a film.

4. A hologram recordable material according to claim 1, wherein said component (b) is contained in the proportion of from 3 to 25% by weight based on said component (a).

5. A hologram recordable material according to claim 1, wherein said triarylhydrazyl sensitizing compound is contained in the proportion of from 0.01 to 25% by weight based on said component (a).

6. A hologram recordable material according to claim 1, wherein said triarylhydrazyl sensitizing compound is a compound represented by the following structural formula:

wherein $Ar^1$ and $Ar^2$ represent independently a substituted or unsubstituted aryl group.

7. A hologram recordable material according to claim 1, wherein said triarylhydrazyl sensitizing compound is any of the compounds of the following formulas (I-1), (I-2) and (I-3):

(I-1)

(I-2)

(I-3)

wherein R represents a substituent such as a halogen atom, a lower alkyl group, an alkoxycarbonyl group, a hydroxyl group and an alkoxy group; and Ph represents a phenyl group.

8. A hologram recordable material according to claim 1 wherein said halogen-containing compound is carbon tetraiodide.

9. A photosensitive material comprising a photosensitive layer comprising a resin composition containing:

(a) a polyvinylcarbazole type polymer;

(b) a halogen-containing compound; and (c) a triarylhydrazyl sensitizing compound which is capable of absorbing light of from visible to near infrared wavelength regions inclusive and sensitizing the halogen-containing compound.

10. A photosensitive material according to claim 9, wherein said photosensitive layer is provided to have a thickness of from 1 μm to 40 μm as a dried film thickness.

11. A photosensitive material according to claim 9, wherein said photosensitive layer is provided on a substrate.

12. A photosensitive material according to claim 9, wherein said photosensitive layer comprises a coating film.

13. A photosensitive material according to claim 9, which is in the form of a film.

14. A photosensitive material according to claim 9, wherein said photosensitive layer has a sensitivity to light of a wavelength region of from 514.5 nm to 830 nm.

15. A photosensitive material according to claim 9, wherein said component (b) is contained in the proportion of from 3 to 25% by weight based on said component (a).

16. A photosensitive material according to claim 9, wherein said triarylhydrazyl sensitizing compound is contained in the proportion of from 0.01 to 25% by weight based on said component (a).

17. A photosensitive material according to claim 9, wherein said triarylhydrazyl sensitizing compound is a compound represented by the following structural formula:

wherein $Ar^1$ and $Ar^2$ represent independently a substituted or unsubstituted aryl group.

18. A photosensitive material according to claim 9, wherein said triarylhydrazyl sensitizing compound is any of the compounds of the following formulas (I-1), (I-2) and (I-3):

(I-1)

-continued (I-2)

(I-3)

wherein R represents a substituent such as a halogen atom, a lower alkyl group, an alkoxycarbonyl group, a hydroxyl group and an alkoxy group; and Ph represents a phenyl group.

19. A photosensitive material according to claim 9 wherein said halogen-containing compound is carbon tetraiodide.

20. A hologram recordable material having a photosensitive composition comprising:
   (a) a polyvinylcarbazole type polymer;
   (b) a halogen-containing compound for accelerating the composition sensitivity to light having the formula $C_aX_bH_c$ wherein $a=1$ or $2$, $b=3$ to $6$ and $c=0$ to $3$; X is I or Br; and
   (c) a triarylhydrazyl compound,
wherein said component (b) is contained in the proportion of from 3 to 25% by weight based on said component (a) and wherein said triarylhydrazyl compound is contained in the proportion of from 0.01 to 25% by weight based on said component (a).

21. A hologram recordable material according to claim 20 wherein said halogen-containing compound is carbon tetraiodide.

* * * * *

UNITED STATES PATENT AND TRADEMARK OFFICE
CERTIFICATE OF CORRECTION

PATENT NO. : 5,418,113  
DATED : May 23, 1995  
INVENTOR(S) : YOKO YOSHINAGA, et al.

Page 1 of 4

It is certified that error appears in the above-indentified patent and that said Letters Patent is hereby corrected as shown below:

ON THE COVER PAGE

[56] References Cited

FOREIGN PATENT DOCUMENTS

"0084452 1/1983 European Pat. Off." should read
--0084452 7/1983 European Pat. Off.--.
"215284 9/1987 Japan" should read
--62-215284 9/1987 Japan--.

COLUMN 1

Line 14, "volume" should read --volume- --.
Line 36, "triphenylmethane type" should read
--triphenylmethane-type--.
Line 52, "volume type" should read --volume-type--.
Line 61, "triarylcarbonium" should read
--triarylcarbonium- --.
Line 67, "polyvinylcarbazole type" should read
--polyvinylcarbazole-type--.

COLUMN 2

Line 2, "triarylcarbonium" should read
--triarylcarbonium- --.
Line 7, "volume type" should read --volume-type--.
Line 16, "polyvinylcarbazole type" should read
--polyvinylcarbazole-type--.
Line 20, "triarylcarbonium" should read
--triarylcarbonium- --.
Line 46, "O" should be deleted.

UNITED STATES PATENT AND TRADEMARK OFFICE
CERTIFICATE OF CORRECTION

PATENT NO. : 5,418,113     Page 2 of 4
DATED : May 23, 1995
INVENTOR(S) : YOKO YOSHINAGA, et al.

It is certified that error appears in the above-indentified patent and that said Letters Patent is hereby corrected as shown below:

COLUMN 3

Line 12, "advantages" should read --advantageous--.
Line 25, "vinyl type" should read --vinyl-type--.
Line 66, "(III). The" should read --(III).¶ The--.

COLUMN 4

Line 50, "group. The" should read --group.¶ The--.
Line 54, "triarylcarbonium" should read
    --triarylcarbonium- --.

COLUMN 5

Line 52, "triarylcarbonyl" should read
    --triarylcarbonyl--

COLUMN 6

Line 4, "bonium type" should read --bonium-type--.
Line 53, "triarylcarbonium" should read
    --triarylcarbonium- --.
Line 64, "buryl" should read --butyl--.

UNITED STATES PATENT AND TRADEMARK OFFICE
CERTIFICATE OF CORRECTION

PATENT NO. : 5,418,113
DATED : May 23, 1995
INVENTOR(S) : YOKO YOSHINAGA, et al.

It is certified that error appears in the above-indentified patent and that said Letters Patent is hereby corrected as shown below:

COLUMN 9

Line 24, "with" should be deleted.
Line 43, "Of" should read --of--.
Line 58, "volume type" should read --volume-type--.
Line 64, "1" should be deleted.

COLUMN 13

Line 50, "to" (second occurrence) should be deleted.

COLUMN 14

Lines 45-50, "Example    should read    --Example
              No.                         No.
               29                          29
                0                          30
                1                          31
                2"                         32--.

COLUMN 15

Line 21, "1.0" should be deleted.

COLUMN 16

Line 18, "volume type" should read --volume-type--.
Line 63, close up left margin.
Line 68, "polyvinylcarbazole type" should read --polyvinylcarbazole-type--.

UNITED STATES PATENT AND TRADEMARK OFFICE
CERTIFICATE OF CORRECTION

PATENT NO. : 5,418,113
DATED : May 23, 1995
INVENTOR(S) : YOKO YOSHINAGA, et al.

It is certified that error appears in the above-indentified patent and that said Letters Patent is hereby corrected as shown below:

COLUMN 17

Line 2, "composition" should read --composition's--.

COLUMN 18

Line 4, "claim 1" should read --claim 1,--.
Line 9, "polyvinylcarbazole type" should read --polyvinylcarbazole-type--.

COLUMN 20

Line 3, "claim 9" should read --claim 9,--.
Line 8, "polyvinylcarbazole type" should read --polyvinylcarbazole-type--.
Line 10, "composition" should read --composition's--.
Line 20, "claim 20" should read --claim 20,--.

Signed and Sealed this

Tenth Day of October, 1995

BRUCE LEHMAN

*Attest:*

*Attesting Officer*     *Commissioner of Patents and Trademarks*